United States Patent
Uezono et al.

(10) Patent No.: US 10,747,920 B2
(45) Date of Patent: Aug. 18, 2020

(54) SEMICONDUCTOR LSI DESIGN DEVICE AND DESIGN METHOD

(71) Applicant: HITACHI, LTD., Tokyo (JP)

(72) Inventors: Takumi Uezono, Tokyo (JP); Tadanobu Toba, Tokyo (JP); Masahiro Shiraishi, Tokyo (JP); Hideo Harada, Tokyo (JP); Satoshi Nishikawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/389,332

(22) Filed: Apr. 19, 2019

(65) Prior Publication Data

US 2019/0332727 A1 Oct. 31, 2019

(30) Foreign Application Priority Data

Apr. 27, 2018 (JP) .................................. 2018-086617

(51) Int. Cl.
*G06F 30/327* (2020.01)
*G06F 30/331* (2020.01)

(52) U.S. Cl.
CPC .......... *G06F 30/327* (2020.01); *G06F 30/331* (2020.01)

(58) Field of Classification Search
USPC ....................................................... 716/104
See application file for complete search history.

(56) References Cited

U.S. PATENT DOCUMENTS

| 6,026,220 A | 2/2000 | Cleereman et al. |
| 2007/0185700 A1* | 8/2007 | Izumi ................... G21C 17/00 703/14 |
| 2008/0312881 A1* | 12/2008 | Kanazawa ............. G06F 30/30 703/1 |
| 2014/0237194 A1 | 8/2014 | Dusanapudi et al. |
| 2017/0364610 A1* | 12/2017 | Uezono .................. G06F 30/34 |

(Continued)

FOREIGN PATENT DOCUMENTS

| EP | 3258401 A1 | 12/2017 |
| JP | 2005-249609 A | 9/2005 |

OTHER PUBLICATIONS

Extended European Search Report dated Oct. 9, 2019 for the European Patent Application No. 19168894.4.

(Continued)

*Primary Examiner* — Mohammed Alam
(74) *Attorney, Agent, or Firm* — Volpe and Koenig, P.C.

(57) ABSTRACT

Provided is a semiconductor LSI design device that includes: a unit that generates a combinational circuit constituted by combining function blocks defined by a function block library from an application specification, by assigning connection information on an operation order of the function blocks; a unit that converts the combinational circuit to operation order information that is applicable to a sequential circuit in which a function block is used a plurality of times in a time-division manner; a unit that inversely converts the generated operation order information to a combinational circuit; a unit that verifies logical equivalence of the combinational circuit and the inversely converted combinational circuit; and a unit that combines the operation order information, the sequential circuit and a function block.

12 Claims, 9 Drawing Sheets

(56) References Cited

U.S. PATENT DOCUMENTS

2019/0332727 A1* 10/2019 Uezono ............... G06F 30/327

OTHER PUBLICATIONS

Blunno et al., "Automated synthesis of micro-pipelines from behavioral Verilog HDL," Proceedings Sixth International Symposium on Advanced Research in Asynchronous Circuits and Systems (ASYNC 2000) (Cat. No. PR00586), Eilat, Israel, pp. 84-92 (2000).

* cited by examiner

[FIG. 1]
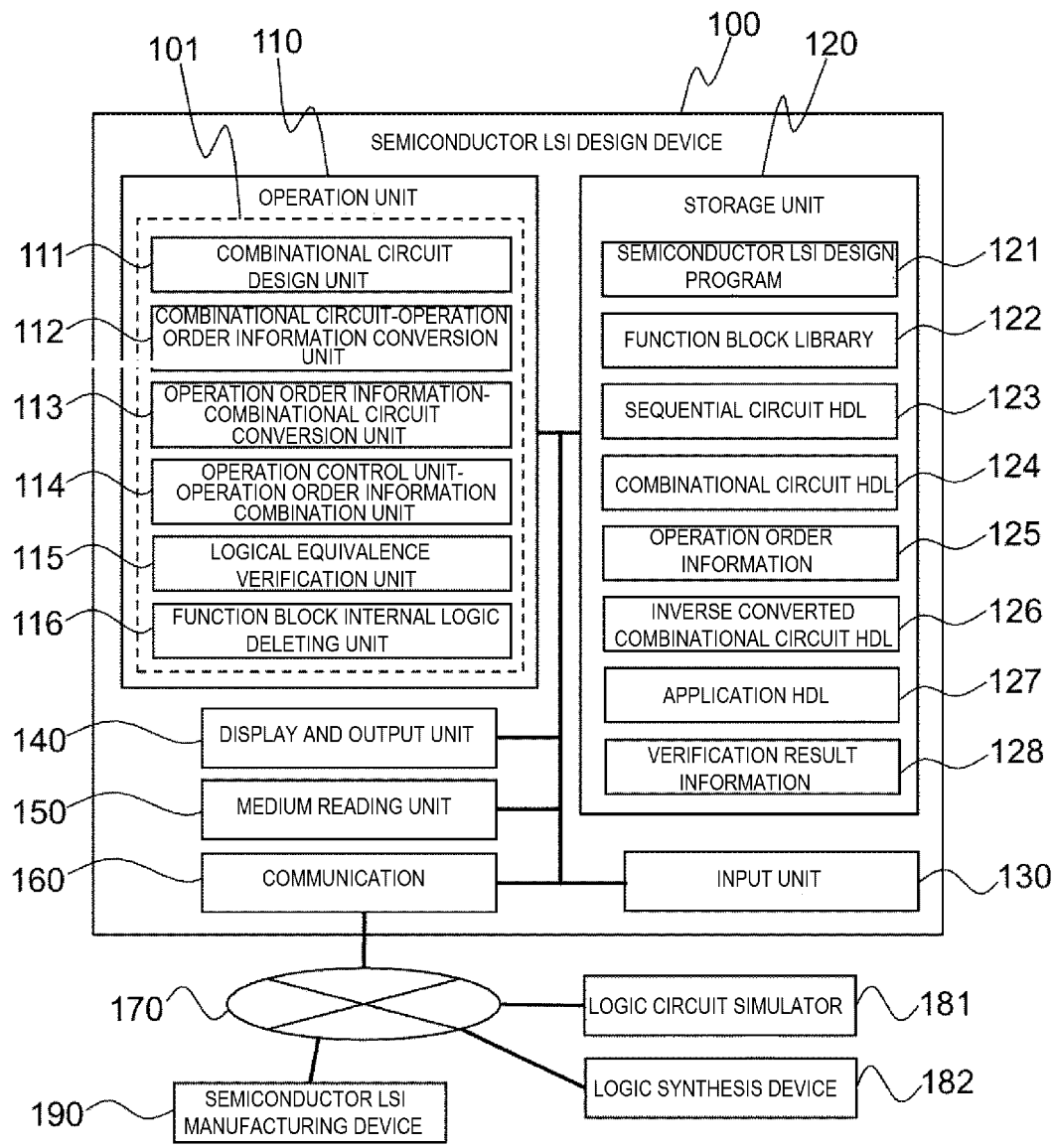

[FIG. 2]
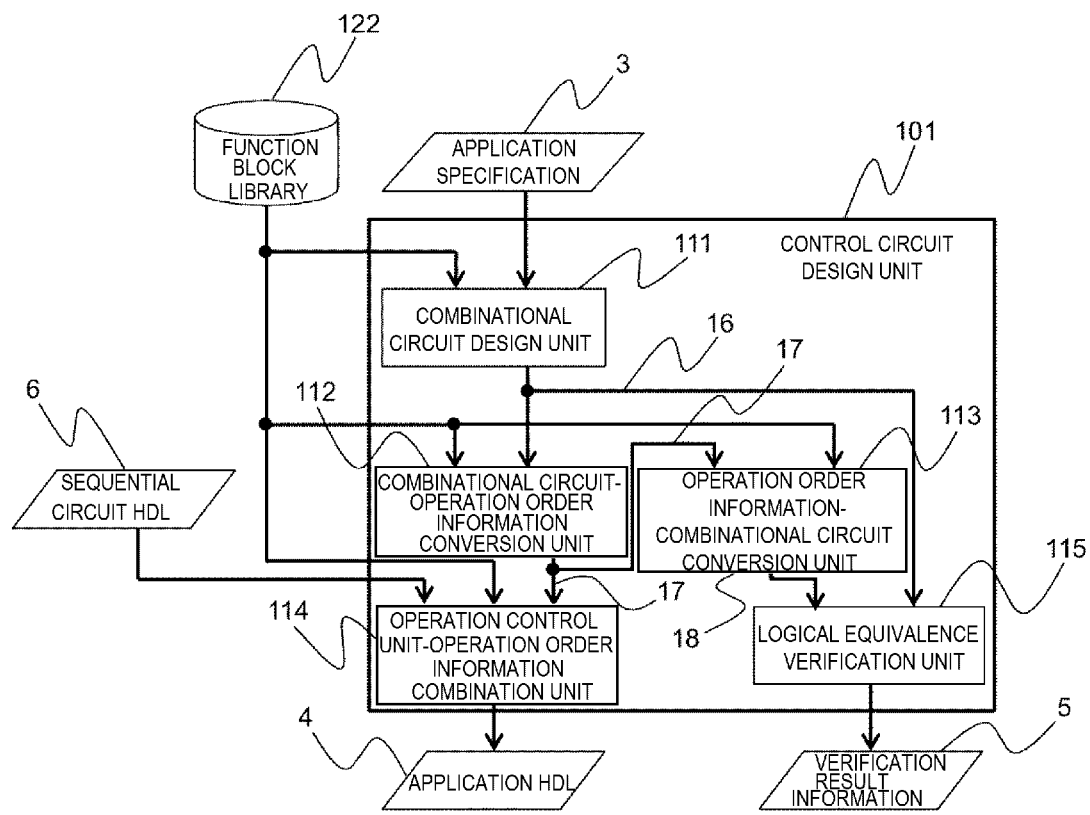

[FIG. 3]
(A)
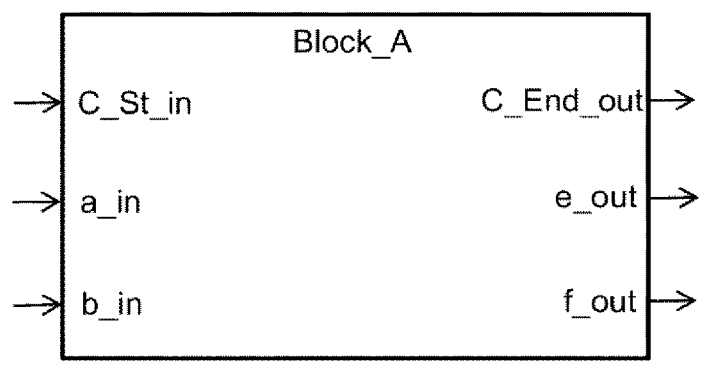
(B)
```
module Block_A (a_in, b_in, C_St_in, e_out, f_out, C_End_out);
    input    a_in, b_in, C_St_in;
    output   e_out, f_out, C_End_out;
    .................
    assign   e_out = ··········
    assign   f_out = ··········
endmodule
```

[FIG. 4]
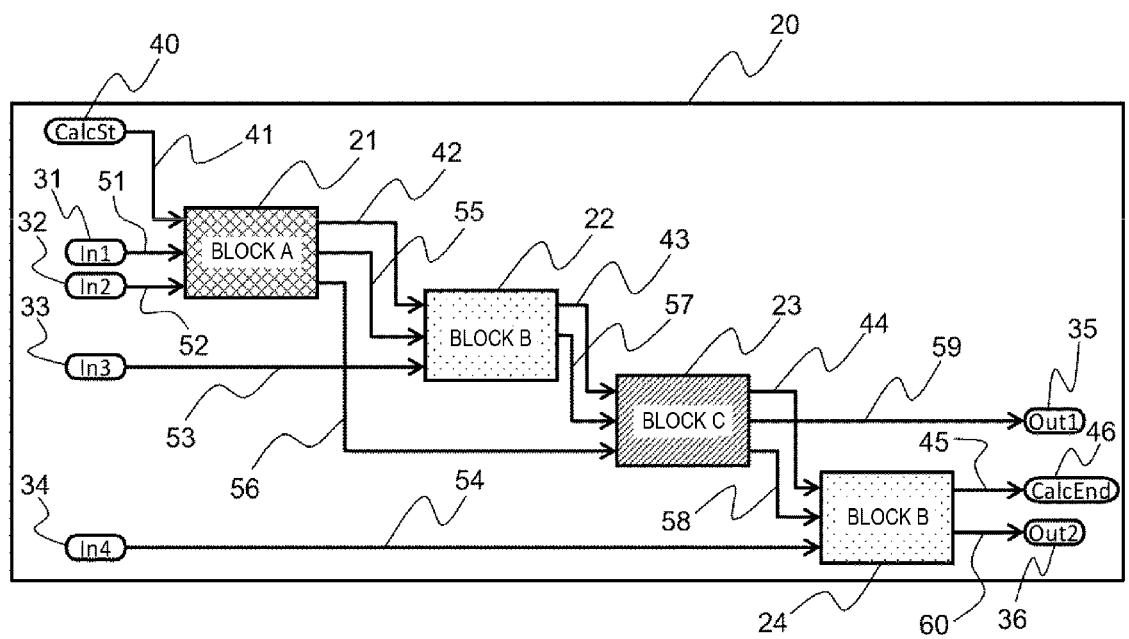

[FIG. 5]

OPERATION ORDER INFORMATION 17(125)

| OPERATION ORDER | FUNCTION BLOCK TYPE | CONNECTION INFORMATION |
|---|---|---|
| 1 | A | 51(I),52(I),55(S),56(S) |
| 2 | B | 55(S),53(I),57(S) |
| 3 | C | 57(S),56(S),59(O),58(S) |
| 4 | B | 58(S),54(I),60(O) |
| ... | ... | ... |

125a, 125b, 125c

| INPUT AND OUTPUT PIN | WIRE |
|---|---|
| In1 | 51 |
| In2 | 52 |
| In3 | 53 |
| In4 | 54 |
| Out1 | 59 |
| Out2 | 60 |
| ... | ... |

125d, 125e

[FIG. 6]
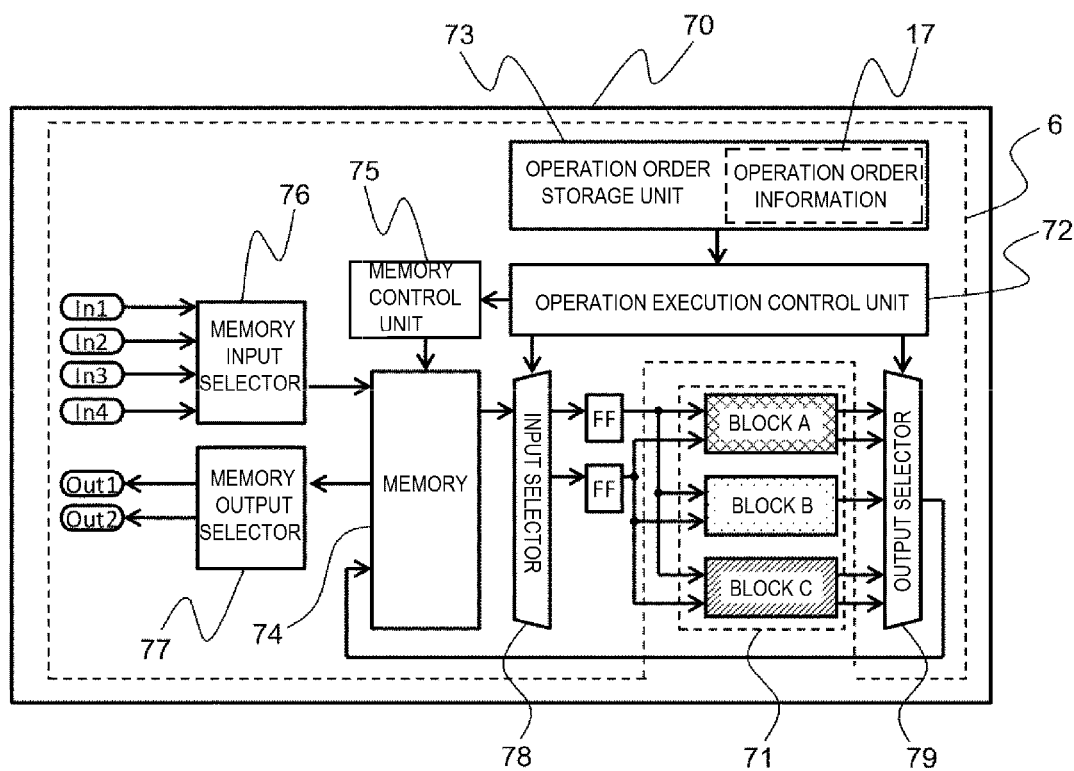

[FIG. 7]
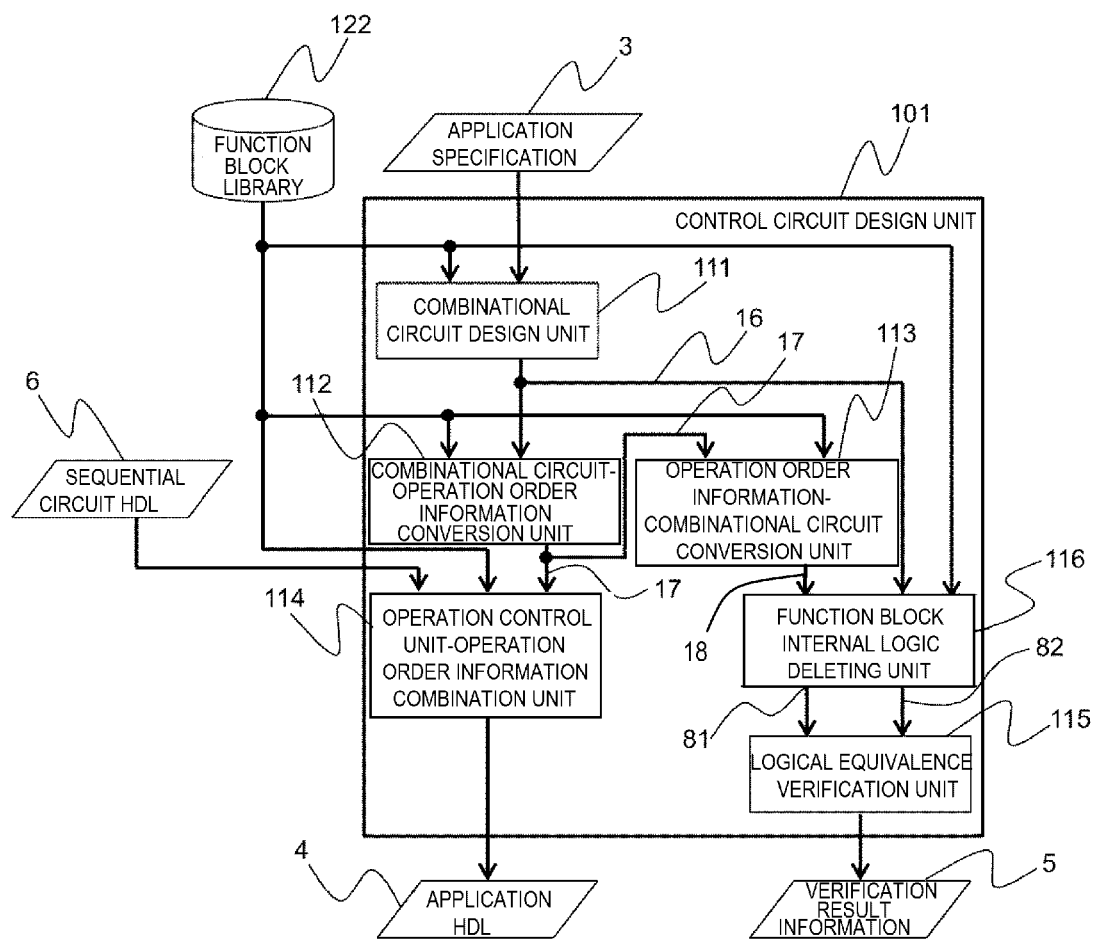

[FIG. 8]
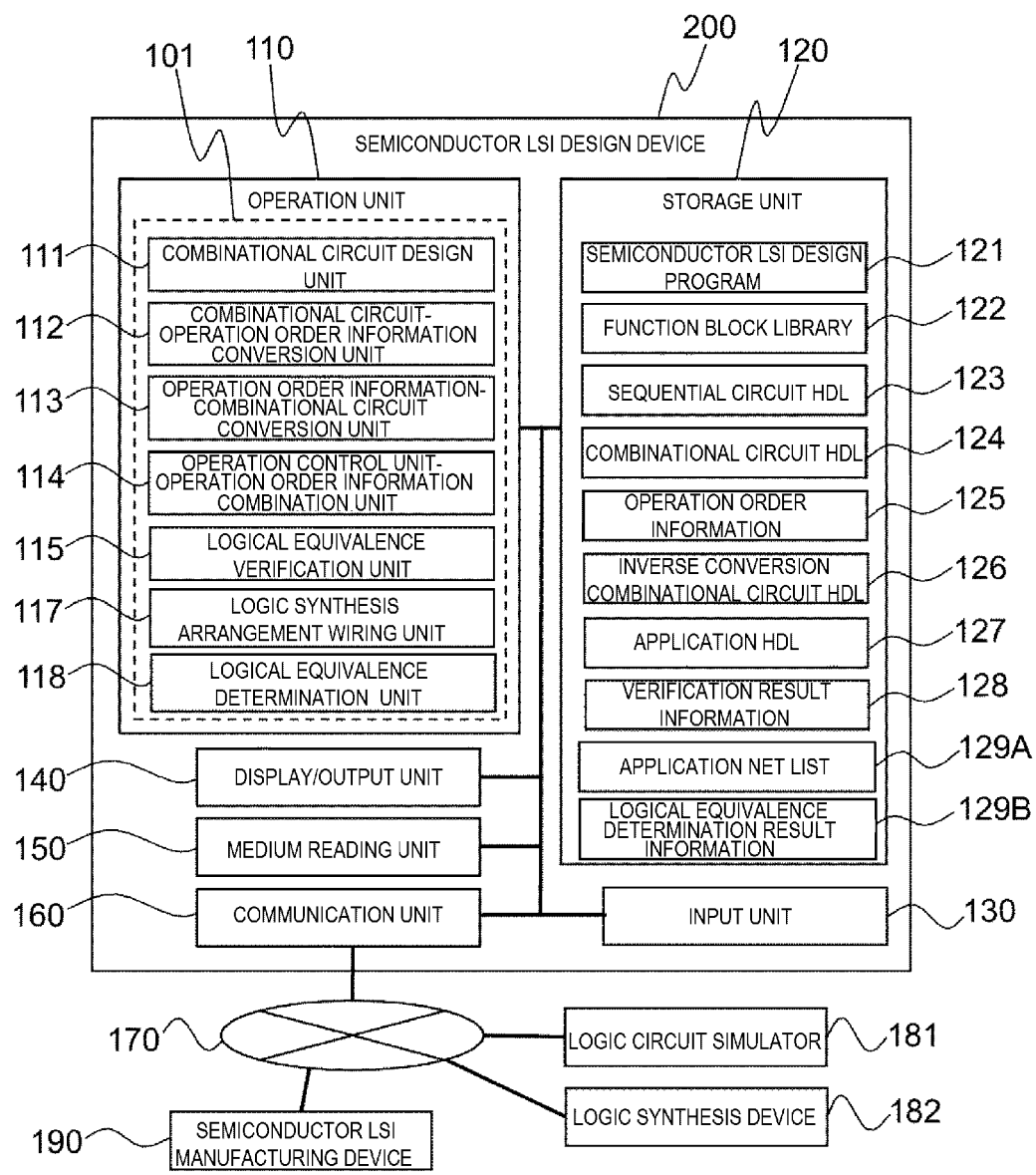

[FIG. 9]
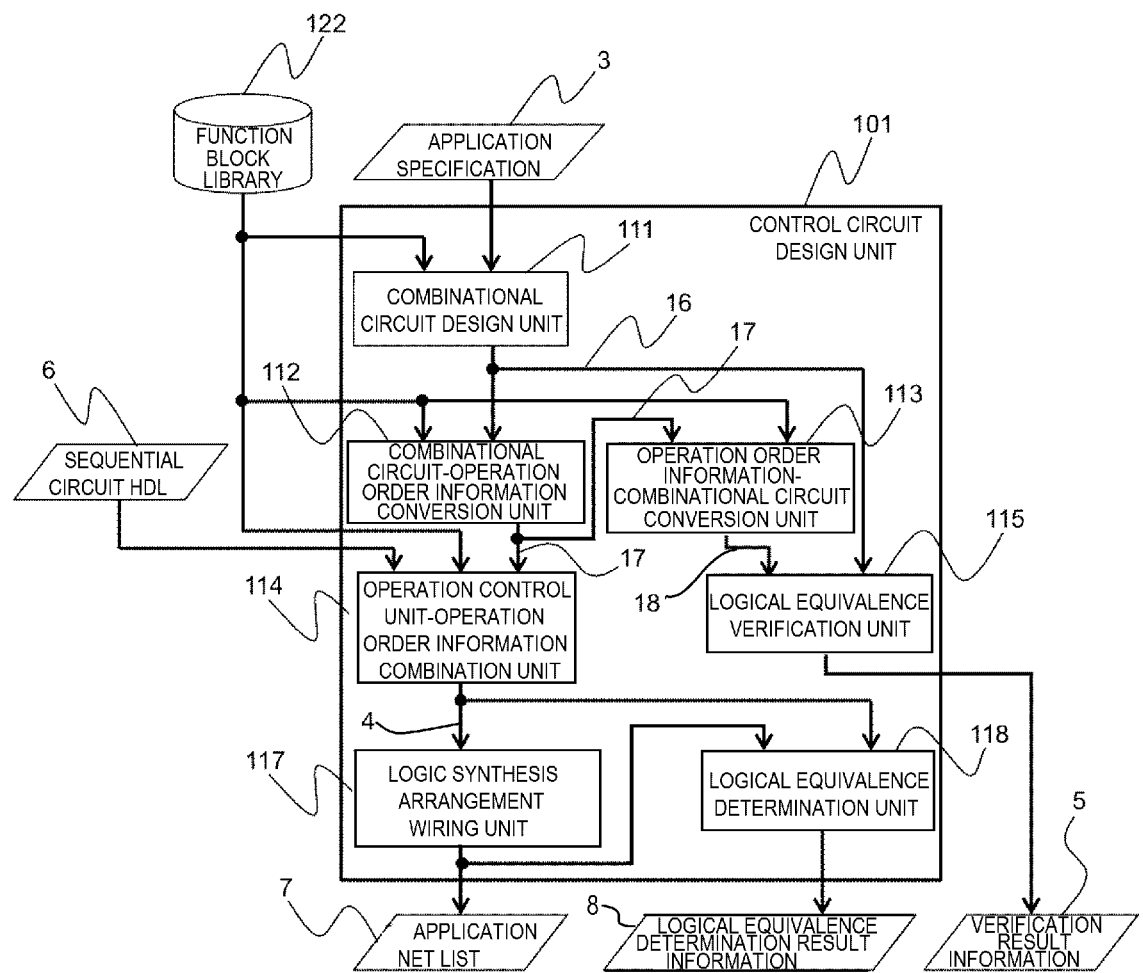

SEMICONDUCTOR LSI DESIGN DEVICE AND DESIGN METHOD

TECHNICAL FIELD

The present invention relates to a semiconductor LSI design device for use in a control device that requires high security, and a design method.

BACKGROUND ART

In the related art, a microcomputer has been used in a control device, and a processorless hard-wired method that aims to improve security and tamper-resistance has been required in a control device that requires high security, for example, a control device of a large plant or a power generation facility. Meanwhile, maintainability has also been required to ensure an easy adjustment for each applicable device. To meet these requirements, an FPGA is beginning to be used for a control device. In particular, a Flash type FPGA having high soft error resistance is beginning to be used in a high-security control device in order to avoid a temporary failure in the control device and consequent breaking down due to a soft error caused by radiation such as neutrons.

As background art, JP-A-2005-249609 (PTL 1) describes "a security protection instrumentation system of a reactor which is constructed by using digital logic that is implemented in hardware selected from ASIC and FPGA, in which a digital logic section is constituted by using at least one of a function unit, in which output logic patterns corresponding to all input logic patterns are verified in advance in a pre-implementation stage, and a function module which is constituted by combining the verified function unit, and the function module is constituted only by a function unit having the same logic configuration as the verified function unit."

PRIOR ART LITERATURE

Patent Literature

PTL 1: JP-A-2005-249609

SUMMARY OF INVENTION

Technical Problem

PTL 1 has described a security protection instrumentation system constituted by a digital signal processing device having high reliability and a handling method thereof. However, resources used when the system is implemented in an LSI such as an FPGA are not mentioned. For example, a Flash type FPGA generally has a smaller logical scale that is applicable for installation as compared with an SRAM type FPGA. In addition, for the purpose of cost reduction, an FPGA having a small logical scale for installation may be used at low cost. For this reason, control logic necessary for a control device cannot be installed in one FPGA, and it is necessary to use a plurality of FPGAs, which may result in a complicated control device and an increased verification cost. Therefore, reduction of resources required for control logic implementation is a significant technique in a control device that requires high security.

In a control device that requires high security, high security is also required in a design process in addition to installation of security functions such as diagnosis or multiplexing. In the design process of the high security control device, it is necessary to verify whether there is consistency or an error before and after each design step, such as from specification to design and from design to implementation. For example, when generating a net list from an RTL description, a logic synthesis tool used in LSI design such as FPGA performs logical equivalence conversions, such as resource optimization or resource share for reducing logic. In design of the high security control device, logical equivalence verification for the RTL description and the net list is required in order to verify that a logical equivalence conversion operation of the tool is performed correctly.

From the above description, implementing and verifying the control logic in a limited implementation resource in the high security control device is one of important technical elements for realizing the high security control device.

Therefore, an object of the invention is to provide a resource reduction technique and a verification technique necessary at the time of logic implementation of a control device.

Solution to Problem

A preferred example of a semiconductor LSI design device of the invention includes: a unit that generates a combinational circuit constituted by combining function blocks defined by a function block library from an application specification, by assigning connection information of an operation order of the function blocks; a unit that converts the combinational circuit to operation order information that is applicable to a sequential circuit in which a function block is used a plurality of times in a time-division manner; a unit that inversely converts the generated operation order information to a combinational circuit; a unit that verifies logical equivalence of the combinational circuit and the inversely converted combinational circuit; and a unit that combines the operation order information, the sequential circuit and a function block.

Further, as other characteristics of the invention, in the semiconductor LSI design device, the sequential circuit used in the unit that converts the combinational circuit to the operation order information of the sequential circuit includes: an operation order storage unit that stores the operation order information; a function block group in which function blocks used at least in the combinational circuit are connected in parallel for each type; a memory that sequentially stores input data and operation results by the function blocks; a memory control unit that reads the data stored in the memory as an input to the function blocks; an input selector that selects the read data as an input to the function block group; an output selector that selects and stores an operation result of the function block group to the memory; and an operation execution control unit that controls the memory control unit, the input selector and the output selector in accordance with the operation order information.

Further, as other characteristics of the invention, in the semiconductor LSI design device, in each function block defined by the function block library, an operation start signal input pin and an operation end signal output pin, which have no relationship in an operation content are defined in addition to an input and output pin for a function that the function block originally realizes.

Advantageous Effect

According to the invention, resources required for logic implementation of a control device can be reduced by a verified method.

Problems, configurations, and effects other than those described above will be clarified by description of following embodiments.

BRIEF DESCRIPTION OF DRAWINGS

FIG. 1 shows an exemplary configuration of a semiconductor LSI design device according to a first embodiment and a second embodiment.

FIG. 2 shows a flow chart of a process of a control circuit design unit according to the first embodiment.

FIG. 3(A) shows an exemplary configuration of an input and output pin of each function block registered in a function block library of the invention, and FIG. 3(B) shows an exemplary definition in an HDL format of the function block.

FIG. 4 shows an exemplary combinational circuit created by a combinational circuit design unit according to the invention.

FIG. 5 shows an exemplary configuration of operation order information generated by a combinational circuit-operation order information conversion unit according to the invention.

FIG. 6 shows an example of an application HDL output by an operation control unit-operation order information combination unit according to the invention.

FIG. 7 shows a flow chart of a process of a control circuit design unit according to the second embodiment.

FIG. 8 shows an exemplary configuration of a semiconductor LSI design device according to a third embodiment.

FIG. 9 shows a flow chart of a process of a control circuit design unit according to the third embodiment.

DESCRIPTION OF EMBODIMENTS

Hereinafter, the embodiments will be described with reference to the drawings.

FIG. 1 shows an exemplary configuration of a semiconductor LSI design device 100 according to the present embodiment.

The semiconductor LSI design device 100 can be constituted on a general purpose computer, and a hardware configuration of the semiconductor LSI design device 100 includes: an operation unit 110 configured by a Central Processing Unit (CPU), a Random Access Memory (RAM) and the like; a storage unit 120 configured by a Read Only Memory (ROM), a Solid State Drive (SSD) using a flash memory or the like, a Hard Disk Drive (HDD), or the like; an input unit 130 configured by an input device such as a keyboard and a mouse; a display and output unit 140 configured by various output devices and a display device such as Liquid Crystal Display (LCD) or organic EL display; a medium reading unit 150 for reading information of a portable storage medium having portability such as a CD-ROM, a USB memory, or the like; and a communication unit 160 configured by a Network Interface Card (NIC) or the like.

The communication unit 160 is connected to a logic circuit simulator 181, a logic synthesis device 182, a semiconductor LSI manufacturing device 190 and the like via a network 170, which are external to the semiconductor LSI design device 100.

The operation unit 110 loads a semiconductor LSI design program 121 stored in the storage unit 120 to the RAM for execution by the CPU, so as to realize a control circuit design unit 101 that has the following function units. The control circuit design unit 101 includes a combinational circuit design unit 111, a combinational circuit-operation order information conversion unit 112, an operation order information-combinational circuit conversion unit 113, an operation control unit-operation order information combination unit 114, a logical equivalence verification unit 115, and a function block internal logic deleting unit 116 in the second embodiment.

The storage unit 120 includes the semiconductor LSI design program (storage area) 121, a function block library (storage area) 122, a sequential circuit HDL (storage area) 123, a combinational circuit HDL (storage area) 124, an operation order information (storage area) 125, an inverse converted combinational circuit HDL (storage area) 126, an application HDL (storage area) 127 and a verification result information (storage area) 128.

FIG. 2 shows a flow chart of a process of the control circuit design unit 101 according to the first embodiment.

The combinational circuit design unit 111 presents a user interface on the display and output unit 140, receives a control circuit where a control circuit designer (user) performs designing thereafter via the input unit 130, based on an application specification 3 and in a format of hardware description language or an input format disposing a figure representing a function block, and produces a combinational circuit. The combinational circuit design unit 111 presents a menu of function blocks that are registered in the function block library 122. The control circuit designer (user) freely disposes the function blocks in the menu, performs wiring between the disposed function blocks, and adds an input and output pin, so as to perform design of the combinational circuit that realizes the application specification 3. The combinational circuit design unit 111 outputs a combinational circuit HDL 16 in an HDL format and stores the combinational circuit HDL 16 in the combinational circuit HDL (storage area) 124.

The function block library 122 of the present embodiment registers various function blocks to be commonly used by control circuits of various applications. The function blocks are for logical operation, four arithmetic operations, integration operation and the like. Although the circuit scale varies, output patterns for all input patterns of the function blocks have block scales applicable for confirming that all patterns of predicted values expected from a design specification match with the output patterns for all input patterns of the function blocks. Each function block is verified in advance by property verification, dynamic verification or the like, and is a registered verified HDL library.

Further, as shown in FIGS. 3(A) and 3(B), in addition to input and output (input pin: a_in, b_in; output pin: e_out, f_out) for a function that the function block originally realizes, an operation start signal input pin (C_St_in) and an operation end signal output pin (C_End_out) which have no relationship in an operation content of the function block are provided. Each function block acquires a value input by the input pin and starts an operation in the function block when a pulse is input to the operation start signal input pin. When the operation in the function block ends, the result of the operation is stored in an output signal, and the pulse is output to the operation end signal output pin.

The function blocks of the present embodiment do not vary in the HDL format, and are registered by defining the operation start signal input pin (C_St_in) and the operation end signal output pin (C_End_out) as shown in FIG. 3(B).

In the combinational circuit design unit 111, the control circuit designer (user) connects the operation start signal pin (input) and the operation end signal pin (output) from a function block that executes operation initially to a function block that executes operation lastly in a row, so as to clearly show an operation order when each function block is disposed.

FIG. 4 shows an example (20) of a block diagram of the combinational circuit HDL 16 created by the combinational circuit design unit 111. In the example of FIG. 4, four function blocks (21 to 24) are arranged in parallel, input pins (31 to 34) and output pins (35 to 36) are arranged, function blocks (21 to 24) and input and output pins are connected by wires (51 to 60) therebetween, so that a combinational circuit of four-input and two-output is realized. In FIG. 4, the function block 22 and the function block 24 have the same function. In order to clearly show an operation execution order, an operation start signal pin CalcSt (40) is provided in the block diagram (20), the operation start signal pin and the function blocks are connected (41 to 44) sequentially according to the operation order, and an operation end signal pin CalcEnd (46) is provided and connected (45) to the function block that executes operation lastly.

Each function block acquires a value input by an input pin and starts an operation in the function block when a pulse is input to an operation start signal input pin. When the operation in the function block ends, the result of the operation is stored in an output signal, and the pulse is output to an operation end signal output pin. Therefore, in order to perform the operation in the block diagram (20) shown in FIG. 4, it is required that operation data be given to the input pins (31 to 34) and that a pulse be input to the operation start signal pin 40 while the operation data is stored. After the operation in the block diagram (20) is finished, since a pulse is output to the operation end signal pin 46, values of the output pins (35 to 36) at that time are results of the operation in the block diagram (20). In a generally used combinational circuit, when operation data is given to an input pin, operation starts at the same time, and the operation order is accordingly not clear. In the present embodiment, the operation order is clearly shown since the pulse input from the operation start signal pin 40 is transmitted through each disposed function block.

However, the method for clearly showing the operation order is not limited to the above, and methods such as one in which an operation order pin (input) is provided in each function block and an integer value indicating the operation order in the operation order pin may also be input.

Returning to the flow chart of the process of the control circuit design unit 101 in FIG. 2, the combinational circuit-operation order information conversion unit 112 analyzes the combinational circuit HDL 16 output by the combinational circuit design unit 111 and generates operation order information 17. FIG. 5 shows an exemplary configuration (125) of the operation order information 17, which includes an operation order (125a), a function block type (125b), connection information (125c), and input and output pin and wire connection information (125d, 125e).

Operations of the combinational circuit-operation order information conversion unit 112 will be described. First, with respect to the input combinational circuit HDL 16, tracing from the operation start signal pin 40 to the operation end signal pin 46, an operation order is assigned in an order of function blocks that have appeared. First, taking one function block as a target for the operation order, the operation order is stored in an operation order column (125a), type data that identifies a function block registered in the function block library 122 is stored in a function block type column (125b), and code data that identifies a wire connected to an input and output pin of the target function block is stored in a connection information column (125c).

In the code data that identifies the wire, there is a characteristic for each wire attribute, and it can be determined that the wire is one of an input pin (I) of the combinational circuit HDL 16, an output pin (O) or a wire (S) between blocks. As an characteristic for each wire attribute, there is a method such as setting an offset in the code data for each attribute (input pin: (I), output pin: (O), and wire between blocks: (s)). It should be noted that the order of the wire code data stored in the connection information column 125c is the order the same as an order of the pins of the function blocks registered in the function block library 122. Further, connection information of the input pins (31 to 34) of the combinational circuit HDL 16, the output pins (35 to 36) and the wires are stored in the input and output and wire connection information columns (125d, 125e). The operations come to an end when information of all function blocks in the combinational circuit HDL 16 is stored in the operation order information (storage area) 125.

Returning to the flowchart of the process of the control circuit design unit 101 in FIG. 2, the operation control unit-operation order information combination unit 114 reads one by one and combines all function blocks used in the combinational circuit HDL 16 among a sequential circuit HDL 6 created in advance and registered in the sequential circuit HDL (storage area) 123, the operation order information 17 created by the combinational circuit-operation order information conversion unit 112 and a function block HDL in the function block library 122, and outputs the function blocks as an application HDL 4.

FIG. 6 shows an exemplary configuration (70) of the application HDL 4 output by the operation control unit-operation order information combination unit 114. The application HDL 4 is constituted by the sequential circuit HDL 6 created in advance, the operation order information 17, and a function block group 71 registered in the function block library 122.

The sequential circuit HDL 6 stores the operation order information 17 in an operation order storage unit 73, uses the function block group 71 in accordance with the operation order information 17, and has a function of performing operations. A configuration of the sequential circuit HDL 6 includes, for example, a memory 74, a memory control unit 75, a memory input selector 76, a memory output selector 77, an input selector 78, an output selector 79, an operation execution control unit 72, and the operation order storage unit 73 that stores the operation order information 17. The sequential circuit HDL 6, and function blocks contained in the function block group 71 are verified in advance. Operations of the circuit are as follows.

Operation 1: One piece of data of input data (In1 to In4) is selected by the memory input selector 76 and stored in the memory 74 controlled by the memory control unit 75.

Operation 2: The operation execution control unit 72 acquires function block types stored in the operation order storage unit 73. The operation order storage unit 73 outputs the function block types in accordance with the operation order.

Operation 3: The memory control unit 75 controls the memory 74 and reads input data from the memory 74. The read data passes through the input selector 78 and is sequentially stored in FF. The input selector 78 is controlled by the operation execution control unit 72.

Operation 4: An operation is performed on one of the function blocks in the function block group 71 by the operation execution control unit 72 in accordance with the operation order.

Operation 5: Output of the function blocks are selected sequentially by the output selector 79 and are sequentially stored in the memory 74. The output selector 79 is controlled by the operation execution control unit 72.

Operation 6: Operations 2 to 5 are performed for all data (each piece of operation order data of the operation order information) stored in the operation order storage unit 73.

Operation 7: Operation result data is read sequentially among data stored in the memory 74, and is output to each output port by the memory output selector 77.

It should be noted that FIG. 6 is an example of a circuit represented by the application HDL 4. For example, a configuration in which the input data is written directly to the FF and the memory 74 is not provided may also be used.

Further, all function blocks contained in the function block library 122 may be installed in the function block group 71, or only function blocks to be used may be installed with reference to the operation order information 17.

Returning to the flow chart of the process of the control circuit design unit 101 in FIG. 2, the operation order information-combinational circuit conversion unit 113 creates an inverse converted combinational circuit HDL 18 in which the function blocks are executed as shown in operation order information 17. Hereinafter, an example of the creation method will be shown.

Procedure 1: Connection information and a type of a function block whose operation order is i is acquired from the operation order information 17.

Procedure 2: Input and output pin information of the function block is acquired, based on the type of the function block and with reference to the function blocks registered in the function block library 122. Since the function block is described by the HDL, the input and output pin information can be acquired easily.

Procedure 3: An HDL instance definition statement that defines an instance of the function block is generated and stored. Generally, since the HDL instance definition statement includes the function block type and wire connection information, the HDL instance definition statement can be uniquely generated based on the information acquired in Procedure 2.

Procedure 4: With reference to wire code data of all wires connected to the function block, a wire definition is added to a module definition statement if a wire is an input and output wire. A definition statement for a wire in the module is added if the wire is not an input and output wire.

Procedure 5: The module definition statement, the wire definition statement, the instance definition statement of the function block and a module end statement are created and output to the inverse converted combinational circuit HDL (storage area) 126 as the inverse converted combinational circuit HDL 18.

The combinational circuit-operation order information conversion unit 112, and the operation order information-combinational circuit conversion unit 113, can also be created as software. At this time, by designing the software respectively by different organizations and different designers and developing the software using different languages and compilers, diversity can be ensured and failures of common factors to the software can be eliminated, so that security can be improved.

The logical equivalence verification unit 115 verifies the logical equivalence of the combinational circuit HDL 16 and the inverse conversion circuit HDL 18, and outputs verification result information 5. The logical equivalence conversion is performed on the combinational circuit HDL 16 and the format is changed. Further, the inverse conversion is performed and the inverse converted combinational circuit HDL 18 is generated by returning to a combinational circuit structure. Accordingly, both of the HDLs to be verified have a combinational circuit structure, and the logical equivalence can be verified easily since constituent elements of the circuit are in one-to-one correspondence. An object of the logical equivalence verification is to verify that the combinational circuit-operation order information conversion unit 112 is operating properly. If the logical equivalence conversion is properly performed as specified, the verification result information 5 always indicates logical equivalence by the combinational circuit-operation order information conversion unit 112 and the operation order information—combinational circuit conversion unit 113. Conversely, if it is logical equivalence, it means that the combinational circuit-operation order information conversion unit 112 is operating properly.

From the above description, according to the invention, a combinational circuit that executes a plurality of function blocks of the same type is converted into operation order information that is applicable to a sequential circuit in which one of the function blocks of the same type is used a plurality of times in a time-division manner, and the operation order information, a sequential circuit HDL and the function blocks are combined to be converted into an application HDL. Therefore, circuit use resource can be reduced. Further, it is possible to verify the validity of the conversion to the operation order information in a short time by inverse conversion of the operation order information and logical equivalence verification.

Accordingly, reduction of the logic of a high security control device and a high security design process can be achieved.

Second Embodiment

FIG. 7 shows a flow chart of a process of a control circuit design unit 101 according to the second embodiment. The same parts as those in FIG. 2 are denoted by the same reference numerals, and descriptions of these parts are omitted since their configurations and operations are the same. In the present embodiment, instead of verifying logical equivalence of the control circuit HDL 16 and the inverse converted combinational circuit 18, HDLs in which logic in a function block is deleted from both HDLs are compared. With reference to FIG. 7, only constituent elements that have been changed from the first embodiment will be described below.

The function block internal logic deleting unit 116 deletes only internal logic of a function block defined by the function block library 122 from the combinational circuit HDL 16 and the inverse converted combinational circuit HDL 18, and outputs an internal-logic-deleted combinational circuit HDL and an internal-logic-deleted inverse converted combinational circuit HDL 82. The two HDLs are input to the logical equivalence verification unit 115 so that logical equivalence thereof is determined. Function blocks registered in the function block library 122 are incorporated in the combinational circuit design unit 111 and the operation order information-combinational circuit conversion unit 113, and it is ensured that logic of function blocks contained in the combinational circuit HDL 16 and the inverse converted combinational circuit HDL 18 is the same. Therefore, even if logical equivalence of the internal logic of the function blocks is not verified, the quality of verification performed by the logical equivalence verification unit 115 is not reduced.

By changing in this way, processing time of the logical equivalence verification unit 115 can be shortened since the logic of logical equivalence verification targets is reduced. Accordingly, verification time and design development time can be shortened without sacrificing security of the design process.

Third Embodiment

FIG. 8 shows an exemplary configuration of a semiconductor LSI design device 200 according to the third embodiment. The difference between the semiconductor LSI design device 200 and the semiconductor LSI design device 100 shown in FIG. 1 lies in that a logic synthesis arrangement wiring unit 117 and a logical equivalence determination unit 118 are newly added to the operation unit 110, and that an application net list (storage area) 129A and a logical equivalence determination result information (storage area) 129B are newly added to the storage unit 120.

FIG. 9 shows a flow chart of a process of the control circuit design unit 101 according to the third embodiment. The same constituent elements as those in FIG. 2 are denoted by the same reference numerals, and descriptions of these parts are omitted since their configurations and operations are the same.

The logic synthesis arrangement wiring unit 117 reads an application HDL 4, performs logic synthesis for implementing to ASIC or FPGA, arranges wires, and outputs an application net list 7. The logical equivalence determination unit 118 determines logical equivalence of the application HDL 4 and the application net list 7, and outputs logical equivalence determination result information 8. The method for logical equivalence determination is the same as that for the logical equivalence verification unit 115.

By changing in this way, a sequential circuit with few circuit use resources can be implemented to ASIC or FPGA, and security of the design process can be improved. The validity of the application HDL 4 can be determined by the operation order information-combinational circuit conversion unit 113 and the logical equivalence verification unit 115. Accordingly, logic of a high security control device can be realized with few circuit resources, the circuit can be implemented to ASIC or FPGA, and high security design process can be realized.

It should be noted that the invention is not limited to the above-described embodiments and includes various modifications. For example, the above-described embodiments have been described in detail for easy understanding of the invention, but the invention is not necessarily limited to all of the described configurations. A part of a configuration of one embodiment can be replaced with a configuration of another embodiment, and a configuration of another embodiment can also be added to a configuration of one embodiment. In a part of a configuration of each embodiment, another configuration can be added, removed, or replaced. The above-described configurations, functions, processing units, processing means, or the like may be achieved by hardware by means of designing a part or all of them with, for example, an integrated circuit. The above-described configurations, functions, or the like may be achieved by software by means of interpreting and executing a program, by a processor, for achieving the respective functions. Information of programs, tables, files or the like for implementing each function can be placed in a recording device such as a memory, a hard disk, and a Solid State Drive (SSD), or a recording medium such as an IC card, an SD card, and DVD.

REFERENCE SIGN LIST

3: application specification
4: application HDL
5: verification result information
6: sequential circuit HDL
7: application net list
8: logical equivalence determination result information
16: combinational circuit HDL
17: operation order information
18: inverse converted combinational circuit HDL
20: example of block diagram of combinational circuit HDL
21-24: function block
31-34: input pin
35-36: output pin
40: operation start signal pin
41-45: operation start signal propagating wire
46: operation end signal pin
51-60: wire
70: configuration example of application HDL
71: function block group
72: operation execution control unit
73: operation order storage unit
74: memory
75: memory control unit
76: memory input selector
77: memory output selector
78: input selector
79: output selector
81: internal-logic-deleted combinational circuit HDL
82: internal-logic-deleted inverse converted combinational circuit HDL
100: semiconductor LSI design device
101: control circuit design unit
110: operation unit
111: combinational circuit design unit
112: combinational circuit-operation order information conversion unit
113: operation order information-combinational circuit conversion unit
114: operation control unit-operation order information combination unit
115: logical equivalence verification unit
116: function block internal logic deleting unit
117: logic synthesis arrangement wiring unit
118: logical equivalence determination unit
120: storage unit
121: semiconductor LSI design program
122: function block library (storage area)
123: sequential circuit HDL (storage area)
124: combinational circuit HDL (storage area)
125: operation order information (storage area)
126: inverse converted combinational circuit HDL (storage area)
127: application HDL (storage area)
128: verification result information (storage area)
129A: application net list (storage area)
129B: logical equivalence determination result information (storage area)
130: input unit
140: display and output unit
150: medium reading unit
160: communication unit 170: network
181: logic circuit simulator
182: logic synthesis device
190: semiconductor LSI manufacturing device

The invention claimed is:

1. A semiconductor LSI design device, comprising:
a unit that generates a combinational circuit constituted by combining function blocks defined by a function block library from an application specification, by assigning connection information on an operation order of the function blocks;
a unit that converts the combinational circuit to operation order information that is applicable to a sequential circuit in which a function block is used a plurality of times in a time-division manner;
a unit that inversely converts the generated operation order information to a combinational circuit;
a unit that verifies logical equivalence between the combinational circuit and the inversely converted combinational circuit, and outputs verification result information indicating logical equivalence when the unit that converts the combinational circuit to operation order information is properly operating; and
a unit that combines the operation order information, the sequential circuit and a function block.

2. A semiconductor LSI design device, comprising:
a unit that generates a combinational circuit constituted by combining function blocks defined by a function block library from an application specification, by assigning connection information on an operation order of the function blocks;
a unit that converts the combinational circuit to operation order information that is applicable to a sequential circuit in which a function block is used a plurality of times in a time-division manner;
a unit that inversely converts the generated operation order information to a combinational circuit;
a unit that deletes logic in a function block from the combinational circuit and the inversely converted combinational circuit;
a unit that verifies logical equivalence between the combinational circuit and the inversely converted combinational circuit of which the logic is deleted by the above unit, and outputs verification result information indicating logical equivalence when the unit that converts the combinational circuit to operation order information is properly operating; and
a unit that combines the operation order information, the sequential circuit and a function block.

3. The semiconductor LSI design device according to claim 1, wherein
the sequential circuit used in the unit that converts the combinational circuit to the operation order information of the sequential circuit includes: an operation order storage unit that stores the operation order information; a function block group in which function blocks used at least in the combinational circuit are connected in parallel for each type; a memory that sequentially stores input data and operation results by the function blocks; a memory control unit that reads the data stored in the memory as an input to the function blocks; an input selector that selects the read data as an input to the function block group; an output selector that selects and stores an operation result of the function block group to the memory; and an operation execution control unit that controls the memory control unit, the input selector and the output selector in accordance with the operation order information.

4. The semiconductor LSI design device according to claim 1, further comprising:
a unit that executes logic synthesis and wire arrangement so as to implement an application HDL output by the unit that combines the operation order information, the sequential circuit and the function block to ASIC or FPGA; and
a unit that determines logical equivalence of the application HDL and an application net list that is generated by executing the logic synthesis and wire arrangement.

5. The semiconductor LSI design device according to claim 1, wherein
in each function block defined by the function block library, an operation start signal input pin and an operation end signal output pin, which have no relationship in an operation content, are defined in addition to an input and output pin for a function that the function block originally realizes.

6. The semiconductor LSI design device according to claim 5,
wherein the unit that converts the combinational circuit to operation order information that is applicable to a sequential circuit, in which a function block is used a plurality of times in a time-division manner, converts the combinational circuit to the operation order information in an order of function blocks that have appeared, tracing from the operation start signal pin to the operation end signal pin.

7. A semiconductor LSI design method, comprising:
generating a combinational circuit constituted by combining function blocks defined by a function block library from an application specification, by assigning connection information on an operation order of the function blocks;
converting the combinational circuit to operation order information that is applicable to a sequential circuit in which a function block is used a plurality of times in a time-division manner;
inversely converting the generated operation order information to a combinational circuit;
verifying logical equivalence between the combinational circuit and the inversely converted combinational circuit;
outputting verification result information indicating logical equivalence when the combinational circuit is properly converted to operation order information; and
combining the operation order information, the sequential circuit and a function block.

8. The semiconductor LSI design method according to claim 7, further comprising:
executing logic synthesis and wire arrangement so as to implement an application HDL output by combining the operation order information, the sequential circuit and the function block to ASIC or FPGA; and
determining logical equivalence of the application HDL and an application net list that is generated by executing the logic synthesis and wire arrangement.

9. The semiconductor LSI design method according to claim 7, wherein
in each function block defined by the function block library, an operation start signal input pin and an operation end signal output pin, which have no relationship in an operation content, are defined in addition to an input and output pin for a function that the function block originally realizes, and when the combinational circuit is converted to operation order information that is applicable to a sequential circuit, in which a function block is used a plurality of times in a time-division manner, the combinational circuit is converted to the operation order information in an order of function blocks that have appeared, tracing from the operation start signal pin to the operation end signal pin.

10. The semiconductor LSI design device according to claim 2, wherein
the sequential circuit used in the unit that converts the combinational circuit to the operation order information of the sequential circuit includes: an operation order storage unit that stores the operation order information; a function block group in which function blocks used at least in the combinational circuit are connected in parallel for each type; a memory that sequentially stores input data and operation results by the function blocks; a memory control unit that reads the data stored in the memory as an input to the function blocks; an input selector that selects the read data as an input to the function block group; an output selector that selects and stores an operation result of the function block group to the memory; and an operation execution control unit that controls the memory control unit, the input selector and the output selector in accordance with the operation order information.

11. The semiconductor LSI design device according to claim 2, wherein
in each function block defined by the function block library, an operation start signal input pin and an operation end signal output pin, which have no relationship in an operation content, are defined in addition to an input and output pin for a function that the function block originally realizes.

12. The semiconductor LSI design device according to claim 11,
wherein the unit that converts the combinational circuit to operation order information that is applicable to a sequential circuit, in which a function block is used a plurality of times in a time-division manner, converts the combinational circuit to the operation order information in an order of function blocks that have appeared, tracing from the operation start signal pin to the operation end signal pin.

* * * * *